United States Patent [19]

Boynton

[11] Patent Number: 4,664,308
[45] Date of Patent: May 12, 1987

[54] MASS SOLDERING SYSTEM PROVIDING AN OSCILLATING AIR BLAST

[75] Inventor: Kenneth G. Boynton, Wilton, N.H.

[73] Assignee: Hollis Automation, Inc., Nashua, N.H.

[21] Appl. No.: 890,415

[22] Filed: Jul. 25, 1986

Related U.S. Application Data

[63] Continuation-in-part of Ser. No. 793,577, Oct. 30, 1985.

[51] Int. Cl.[4] .......................... B23K 1/00; B23K 31/02
[52] U.S. Cl. ................................. 228/180.1; 228/260; 228/20; 228/37; 118/63
[58] Field of Search ...................... 228/180.1, 260, 20, 228/37; 118/63

[56] References Cited

U.S. PATENT DOCUMENTS

| | | | |
|---|---|---|---|
| 3,603,329 | 9/1971 | White | 228/20 |
| 3,681,118 | 8/1972 | Ohama et al. | 118/63 |
| 3,865,298 | 2/1975 | Allen et al. | 228/20 |
| 4,083,323 | 4/1978 | Rote | 228/20 |
| 4,315,042 | 2/1982 | Spigarelli | 228/20 |
| 4,401,253 | 8/1983 | O'Rourke | 228/20 |

FOREIGN PATENT DOCUMENTS 2137898 2/1973 Fed. Rep. of Germany ........ 228/20

Primary Examiner—Nicholas P. Godici
Assistant Examiner—Samuel M. Heinrich
Attorney, Agent, or Firm—Hayes, Davis & Soloway

[57] ABSTRACT

A soldering system is described in which a fluid stream is directed onto a solder board substantially immediately following the deposition of molten solder onto the boards. The impinging fluid stream is rapidly oscillated to create a plurality of different angles of impingement of the air on each area of the bottom surface of the circuit board.

15 Claims, 2 Drawing Figures

MASS SOLDERING SYSTEM PROVIDING AN OSCILLATING AIR BLAST

BACKGROUND OF THE INVENTION

This application is a continuation in part of my co-pending appication Ser. No. 793,577 filed Oct. 30, 1985.

The present invention is directed to an improvement in a mass soldering system of the type described in the earlier patents of H. T. O'Rourke (owned by the owner of the present application), U.S. Pat. Nos. 4,410,126 and 4,401,253. This prior patented system involves directing a hot air knife blast onto the bottom surface of a printed component-carrying circuit board, the air blast impinging on the surface immediately after the printed circuit board leaves a wave soldering system. The impinging air blast is reported to reduce the incidence of solder shorts, icicling and/or bridging, and has achieved widespread adoption.

In working with the previously patented system of O'Rourke, it has been found that with certain types of components, particularly chips, component orientation and circuit configurations, different angles of air blast give optimum solder removal to prevent solder shorts, icicling and/or bridging.

BRIEF SUMMARY OF THE INVENTION

In the present invention, the mass soldering system of the type described in the above mentioned patents of O'Rourke is modified by providing an oscillating air blast which provides for rapid oscillation of the air knife to create a plurality of different angles of impingement of the air on each area of the bottom surface of the circuit board as it leaves the solder wave. As a result of the present invention, each area of the circuit board is subjected to hot air blasts coming from a plurality of different angles so that, no matter what type of circuit element is connected to the board at any particular point, it will, at some time during the oscillation of the air knife blast, be subjected to that angle which is optimum for removal of the solder constituting potential solder bridges, icicles and/or bridges.

DETAILED DESCRIPTION OF THE INVENTION

Figure 1:
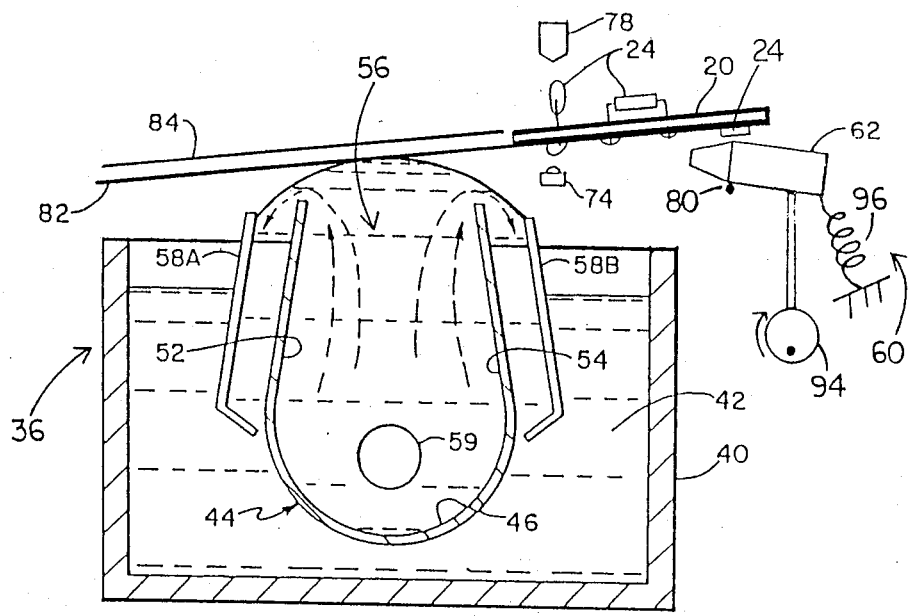
Figure 2:
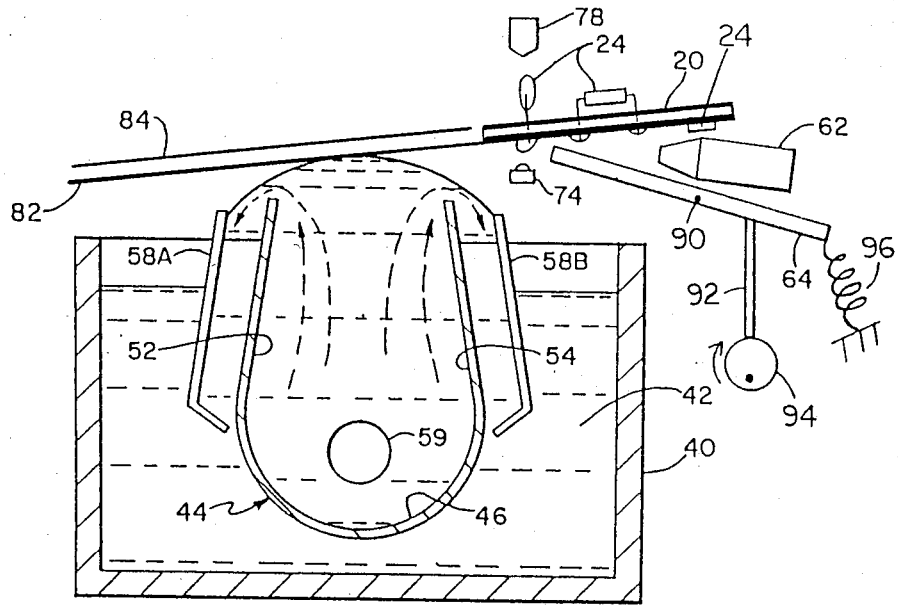

In order to more fully understand the invention, reference should be had to the following detailed description of a preferred form of the invention, this description being largely based on the previously patented invention described in U.S. Pat. No. 4,410,126, the disclosure of which is embodied herein in its entirety. For a fuller understanding of the objects of the present invention, reference should be had to the following detailed description taken in connection with the accompanying drawing in which like numerals depict like parts, and:

FIG. 1 is a side elevational view partly in section of one form of soldering apparatus made in accordance with the invention showing a movable air knife arranged to provide an oscillating air blade to the underside of a circuit board as it leaves the wave solder; and FIG. 2 is a side elevational view partly in section of an alternative form of soldering apparatus showing a fixedly positioned air knife and having a movable baffle or deflector plate arranged to provide an oscillating air blast to the underside of a circuit board as it leaves the solder wave.

In the following detailed description of the present invention, various terms such as components, leads, solder, etc., shall have the same meaning as described in more detail in the above mentioned U.S. Pat. Nos. 4,410,126 and 4,401,253 of O'Rourke.

For convenience, the drawings in the present invention are illustrated as a modification of FIG. 2 of the above mentioned U.S. Pat. No. 4,410,126, and reference numerals employed in the present drawing are the same as those used in FIG. 2 of the earlier U.S. Pat. No. 4,410,126.

Referring to FIG. 1 of the drawing, the printed circuit board, after passing through standard fluxing and preheating stations, is passed through a mass wave soldering station 36. The components 24 may be mounted on the upper surface of the board with leads protruding downwardly through holes in the board or may be secured to the bottom surface of the board (such as by means of an adhesive) with the leads protruding therefrom to contact lands on the board. In both cases the mass soldering station completes the electrical and mechanical connections of the component leads to the board. The mass wave soldering station includes a container of conventional design indicated generally at 40 for holding a supply of molten solder 42. Conventional heating means (not shown) may be secured to the bottom and/or side walls of container 40 or immersed in the solder to heat and maintain the supply of solder 42 in molten condition.

A sump and nozzle assembly indicated generally at 44 is disposed interiorly of container 40. The sump and nozzle assembly 44 is of conventional design and typically comprises a rounded bottom wall 46, a pair of substantially vertically opposed end walls, and a pair of inclined side walls 52 and 54. The upper ends of the end walls and side walls 52 and 54 are spaced from one another to form a narrow elongated rectangular nozzle or slot 56 which extends above the molten solder level in container 40 for a suitable distance, e.g. one inch above the molten solder level.

Preferably, the sump also includes a pair of adjustable sluice plates 58A, B spaced from the sump side walls 52 and 54 for controlling solder overflow from the nozzle 56, e.g. in accordance with the teachings of U.S. Pat. No. 3,398,873 to Kenneth G. Boynton. Completing the soldering station is a variable speed pump (not shown) which communicates through an intake orifice 59 in the lower end of sump and nozzle assembly 44 for pumping solder into the sump where it then rises and overflows the nozzle 56 as a standing solder wave.

An important feature and critical requirement of the present invention is the ability to relocate excess solder on, and/or remove excess solder from the bottom of the circuit board, and from any interconnections, component leads and/or component bodies carried thereon before the solder can solidify as shorts, icicles and/or bridges. This is accomplished by treating the soldered circuit board and depending component leads at an excess solder removal station 60. Excess solder removal station 60 follows soldering station 36 immediately in-line and is designed to relocate or blow off excess solder from the board underside before the solder solidifies as shorts, icicles and/or bridges. Solder removal station 60 comprises one or more fluid jets, fluid knives, slots, nozzles or the like indicated generally at 62, from which a fluid stream, e.g. air, can be directed onto the underside of the board. Desirably, but not necessarily, the fluid is pre-heated prior to impinging on the board.

Fluid flow rate, fluid pressure, and fluid temperature and the time elapsed between circuit board emersion from the solder wave and beginning of contact by the fluid stream may vary widely depending on the board temperture, ambient temperature, melting point of the solder, specific heat of fluid and heat transfer coefficient of fluid to the board, board size and shape, component density, amount of solder deposited and to be removed, conveyor speed, and distance between the soldering station and the excess solder removal station. Preferably nozzle 62 is disposed proximate the path of travel of the boards. Nozzle 62 of course must be spaced sufficiently below the path of travel of the boards to permit clearance of the longest depending lead, etc. Inert gas may be used as the fluid, but preferably the impinging fluid comprises air. The fluid may be at ambient temperature; preferably, however, the fluid is pre-heated to a temperature in the range of about 93° C. to 350° C., preferably about 290° C. to 300° C. (measured at the outlet of nozzle 62). For 63/37 solder alloy, the preferred fluid preheat temperature is about 290° C. (measured at the outlet of nozzle 62).

The oscillating fluid stream impinging on still molten solder contained on the underside of the circuit board, the interconnections, and the component leads and/or bodies relocates excess solder on, and/or blasts excess solder from the underside of the board, interconnections, leads, and bodies, and in doing so also minimizes the possibility of solder briding or icicling or short formation upon solidification.

To accomplish the present invention of changing the angle of impingement of the air blast relative to the circuit board lower surface, the nozzle 62 is mounted on a pivot point 80. The angle of impingement, which may be varied over a wide range, preferably between about 40° and about 75°, more preferably about 45° to about 65°, is controlled by a combination of arm 82 traveling on a cam 84, which arm is kept in contact with the cam by means of a spring 86. The angle of impingement of the air blast relative to the circuit board should be continuously rapidly varied over the aforesaid range so that each portion of the board is subjected to a wide range of angles. Preferably, the complete cycle of angles is repeated every 0.1 to 1.0 seconds, more preferably every 0.1 to 0.15 seconds.

Various changes may be made in the foregoing invention without departing from the inventive features described herein.

For example, as illustrated in FIG. 2, the nozzle 62 may be fixedly located in place so that a blast of air emerges at a nozzle at a constant angle. In order to change the angle of impingement of the air blast relative to the circuit board, a deflector plate 64, mounted on a pivot point 90, is positioned under the path of travel of boards 20, adjacnt to and extending beyond the outlet of nozzle 62 back towards the solder wave. The angle of deflector plate 64 is controlled by movement of an arm 92 traveling on a driven cam 94, which arm is kept in contact with the cam by means of a spring 96. Also, control means including a photoelectric cell 74 and light source 78 may be provided as in accordance with the teachings of U.S. Pat. No. 4,410,126 to O'Rourke, for regulating the blast of air from the nozzle.

Still other changes will be obvious to one skilled in the art. Accordingly, it is intended that all matter contained in the above description or shown in the accompanying drawings shall be interpreted in an illustrative and not in a limiting sense.

I claim:
1. In a method of mass joining with solder printed circuit boards having mounted thereon components with leads protruding therefrom, said method comprising the steps of:

depositing a quantity of molten solder onto the underside of said board and said protruding leads by passing the bottom surface of the board over a solder wave and substantially immediately following said depositing impinging a fluid stream directly into the molten solder deposited on the underside of said board and said protruding leads by means of fluid blast directed towards the solder wave and impinging on the bottom surface of the board sufficiently soon after it leaves the solder wave so that the solder is still molten, the fluid blast having sufficient velocity to remove essentially all bridges and shorts but not sufficient velocity to adversely affect properly wetted joints, the improvement wherein the angle of impingement of the fluid blast relative to the circuit board bottom surface is continuously varied in a predetermined cycle so that the each portion of the bottom surface of the board is subject to a fluid blast from a plurality of different angles.

2. A method according to claim 1, wherein the angle is varied between about 40° and 75°.

3. A method according to claim 2, wherein the angle is varied between about 45° and 65°.

4. A method according to claim 3, wherein a complete cycle of angles is repeated every 0.1 to 1.0 seconds.

5. A method according to claim 4, wherein a complete cycle of angles is repeated every 0.1 to 0.15 seconds.

6. A method according to claim 1, wherein the fluid comprises air.

7. A method according to claim 6, and including the step of heating the air prior to impinging the air on the board.

8. In an apparatus for mass joining with solder electrical and electronic components assembled in a circuit board wherein said components have leads which protrude therefrom, and comprising in combination:

a wave soldering station adapted to provide a wave of molten solder;

means for transporting said circuit board across said solder whereby a quantity of molten solder may be deposited onto said circuit board underside and said protruding leads; and an excess solder removal station adjacent said wave soldering station, said excess solder removal station comprising at least one fluid knife disposed below the travel paths of said board and adapted to direct a blast of fluid directly onto the molten solder deposited on said board underside, a source of pressurized fluid means connecting said source and said fluid knife, the fluid blast being directed towards the solder wave and impinging on the bottom surface of the board sufficiently soon after it leaves the solder wave so that the solder is still molten, the fluid blast having sufficient velocity to remove essentially all bridges and shorts but not sufficient velocity to adversely affect properly wetted joints, the improvement wherein means are provided for continuously varying the angle of impact of the fluid blast from the fluid knife in a predetermined cycle so each portion of the bottom surface of the board is subject to a fluid blast from a plurality of different angles.

9. The apparatus of claim 8, wheein the angle is varied between about 40° and 75°.

10. The apparatus of claim 9, wherein the angle is varied between about 45° and 65°.

11. The apparatus of claim 8, wherein a complete cycle of angles is repeated every 0.1 to 1.0 seconds.

12. The apparatus of claim 11, wherein a complte cycle of angles is repeated every 0.1 to 0.15 seconds.

13. In an apparatus for mass joining with solder electrical and electronic components assembled in a circuit board wherein said components have leads which protrude therefrom, and comprising in combination:
- a wave soldering station adapted to provide a wave of molten solder;
- means for transporting said circuit board across said solder whereby a quantity of molten solder may be deposited onto said circuit board underside and said protruding leads; and
- an excess solder removal station adjacent said wave soldering station, said excess solder removal station comprising at least one fluid knife disposed below the travel paths of said board and adapted to direct a blast of fluid directly onto the molten solder deposited on said board underside, a source of pressurized fluid means connecting said source and said fluid knife, the fluid blast being directed towards the solder wave and impinging on the bottom surface of the board sufficiently soon after it leaves the solder wave so that the solder is still molten, the fluid blast having sufficient velocity to remove essentially all bridges and shorts but not sufficient velocity to adversely affect properly wetted joints,
- the improvement wherein means are provided for continuously varying the angle of impact of the fluid blast from the fluid knife so each portion of the bottom surface of the board is subject to a fluid blast from a plurality of different angles, said air knife comprising a nozzle which is mounted on a pivot, and said means for varying comprises a driven cam and cam follower operatively connected to said nozzle.

14. In an apparatus for mass joining with solder electrical and electronic components assembled in a circuit board wherein said components have leads which protrude therefrom, and comprising in combination:
- a wave soldering station adapted to provide a wave of molten solder;
- means for transporting said circuit board across said solder whereby a quantity of molten solder may be deposited onto said circuit board underside and said protruding leads; and
- an excess solder removal station adjacent said wave soldering station, said excess solder removal station comprising at least one fluid knife disposed below the travel paths of said board and adapted to direct a blast of fluid directly onto the molten solder deposited on said board underside, a source of pressurized fluid means connecting said source and said fluid knife, the fluid blast being directed towards the solder wave and impinging on the bottom surface of the board sufficiently soon after it leaves the solder wave so that the solder is still molten, the fluid blast having sufficient velocity to remove essentially all bridges and shorts but not sufficient velocity to adversely affect properly wetted joints,
- the improvement wherein means are provided for continuously varying the angle of impact of the fluid blast from the fluid knife so each portion of the bottom surface of the board is subject to a fluid blast from a plurality of different angles, said air knife comprising a nozzle which is fixedly positioned, and including a baffle plate located adjacent the outlet of said nozzle, said baffle plate being pivotally mounted, and said means for varying comprises a driven cam and cam follower operatively connected to said baffle plate.

15. The apparatus of claim 11, wherein said fluid comprises air, and includes means for heating said air prior to directing the latter onto said board.

* * * * *